United States Patent
Hotta (10) Patent No.: US 7,330,502 B2
(45) Date of Patent: Feb. 12, 2008

(54) INPUT/OUTPUT CIRCUIT AND SEMICONDUCTOR INTEGRATED CIRCUIT

(75) Inventor: Yuuichi Hotta, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 693 days.

(21) Appl. No.: 10/825,487

(22) Filed: Apr. 14, 2004

(65) Prior Publication Data

US 2004/0250180 A1    Dec. 9, 2004

(30) Foreign Application Priority Data

Apr. 28, 2003 (JP) ............................ P2003-124285

(51) Int. Cl.
*H04B 1/38* (2006.01)

(52) U.S. Cl. ...................... 375/221; 370/241; 370/249; 375/219; 379/26.02; 379/166; 379/377; 700/81; 700/121; 701/31; 714/734

(58) Field of Classification Search ................ 370/241; 714/735; 345/98

See application file for complete search history.

(56) References Cited

U.S. PATENT DOCUMENTS

| | | | |
|---|---|---|---|
| 6,201,829 B1 | 3/2001 | Schneider | |
| 6,208,621 B1 * | 3/2001 | Ducaroir et al. | ............ 370/241 |
| 2001/0016929 A1 * | 8/2001 | Bonneau et al. | ............ 714/735 |
| 2002/0140662 A1 * | 10/2002 | Igarashi | ....................... 345/98 |

* cited by examiner

*Primary Examiner*—David C. Payne
*Assistant Examiner*—Adolf DSouza
(74) *Attorney, Agent, or Firm*—DLA Piper US LLP

(57) ABSTRACT

An input/output circuit includes a reference clock generator configured to generate a reference clock. A signal transmitter is configured to transmit serial data in synchronization with one of the reference clock and a test clock. A signal-receiving circuit is configured to receive the serial data, and to generate a converted signal from the serial data. A test circuit is configured to detect an error between each phase of the converted signal and the test clock when the signal transmitter operates in synchronization with the test clock.

19 Claims, 8 Drawing Sheets

INPUT/OUTPUT CIRCUIT AND SEMICONDUCTOR INTEGRATED CIRCUIT

CROSS REFERENCE TO RELATED APPLICATIONS

This application is based upon and claims the benefit of priority from the prior Japanese Patent Applications No. P2003-124285, filed on Apr. 28, 2003; the entire contents of which are incorporated herein by reference.

BACKGROUND OF THE INVENTION

1. Field of the Invention

The present invention relates to a built-in self-test system, more particularly, to an input/output (I/O) circuit, and to a semiconductor integrated circuit, capable of performing a self-test.

2. Description of the Related Art

In respect to an I/O circuit transmitting and receiving data via a port, the technique to transmit and receive the data with a clock as a synchronizing signal has been proposed. In the technique of transmitting and receiving the data with the clock, when a transfer rate increases, a phase error is generated between each phase of the data and the clock. For this reason, the technique of only transmitting and receiving data is usually adopted when the transfer rate is high. In case of testing a semiconductor integrated circuit integrating the I/O circuit, the technique of testing the I/O circuit by feeding back output data supplied by an output terminal to an input terminal is known (hereinafter referred to as "a loop-back test"). Furthermore, the technique of integrating a test circuit on a semiconductor chip has been proposed (hereinafter referred to as "a built-in self-test (BIST)").

With respect to the loop-back test, occurrence of an error is tested by supplying the output data to the input terminal for a fixed period. A guarantee value of a signal-receiving circuit is an error rate of less than or equal to $10^{-12}$ bits. In this case, more than 5 minutes is necessary to transmit $10^{12}$ bits of data bit at a rate of 3.2 [Gbps]. As described above, decrease of test efficiency of a semiconductor integrated circuit occurs since test time increases.

SUMMARY OF THE INVENTION

An aspect of the present invention inheres in an input/output circuit encompassing, a reference clock generator configured to generate a reference clock, a signal transmitter configured to transmit serial data in synchronization with one of the reference clock and a test clock, a signal-receiving circuit configured to receive the serial data, and to generate a converted signal from the serial data, and a test circuit configured to detect an error between each phase of the converted signal and the test clock when the signal transmitter operates in synchronization with the test clock.

Another aspect of the present invention inheres in a semiconductor integrated circuit encompassing, an input/output circuit configured to transmit serial data in synchronization with a test clock, to generate a converted signal from the serial data, and to detect an error between each phase of the converted signal and the test clock, and an internal circuit configured to perform transmission and reception of signals to external circuits via the input/output circuit.

DETAILED DESCRIPTION OF THE INVENTION

Various embodiments of the present invention will be described with reference to the accompanying drawings. It is to be noted that the same or similar reference numerals are applied to the same or similar parts and elements throughout the drawings, and description of the same or similar parts and elements will be omitted or simplified. In the following descriptions, numerous specific details are set forth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention with unnecessary detail. In the following description, the words "connect" or "connected" defines a state in which first and second elements are electrically connected to each other without regard to whether or not there is a physical connection between the elements.

Figure 1:
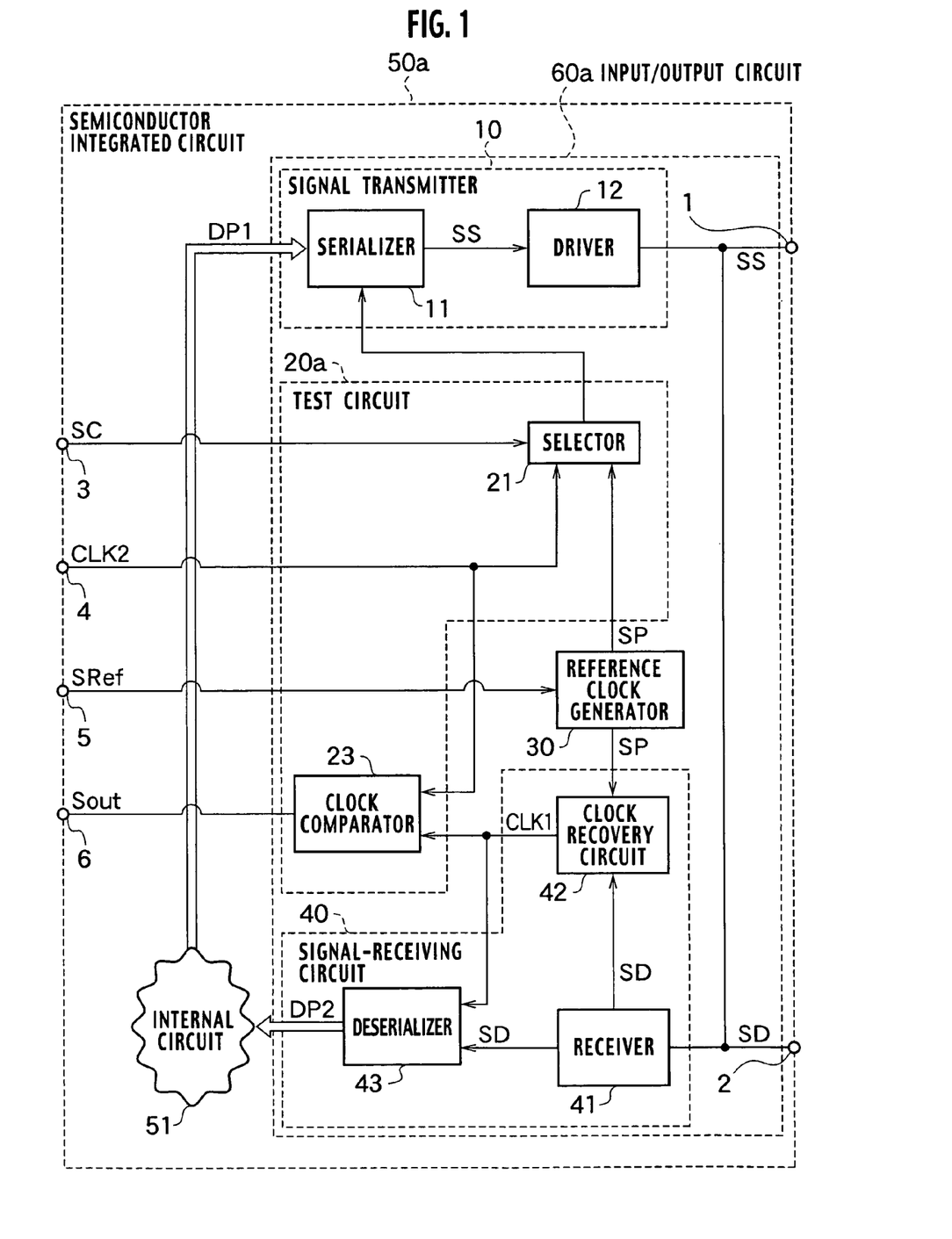
FIG. 1 is a block diagram showing a semiconductor integrated circuit according to an embodiment of the present invention.

As shown in FIG. 1, a semiconductor integrated circuit according to an embodiment of the present invention includes an internal circuit 51, and an input/output (I/O) circuit 60a connected to the internal circuit 51. The internal circuit 51 transmits serial data SS to external circuits via the I/O circuit 60a. The internal circuit 51 receives serial data SD from external circuits via the I/O circuit 60a. The I/O circuit 60a includes a reference clock generator 30, a signal transmitter 10, a signal-receiving circuit 40, and a test circuit 20a. The reference clock generator 30 generates a reference clock SP. The signal transmitter 10 transmits serial data SS in synchronization with one of the reference clock SP and a test clock CLK2. The signal-receiving circuit 40 receives the serial data SS, and generates a converted signal from the serial data SS. The test circuit 20a detects an error between each phase of the converted signal and the test clock CLK2 when the signal transmitter 10 operates in synchronization with the test clock CLK2. The reference clock generator 30 controls a frequency of the reference clock SP in accordance with a reference signal SRef transmitted from external circuits of the semiconductor integrated circuit 50a via a reference terminal 5.

Furthermore, the signal-receiving circuit 40 includes a receiver 41, a clock recovery circuit 42, and a deserializer 43. The receiver 41 is connected to an input terminal 2. The clock recovery circuit 42 is connected between the receiver 41 and reference clock generator 30. The deserializer 43 has an input side connected to the receiver 41 and the clock recovery circuit 42, and an output side connected to the internal circuit 51. The receiver 41 buffers the serial data SD. The clock recovery circuit 42 generates a recovery clock CLK1 based on the buffered serial data SD and the reference clock SP. The deserializer 43 converts the buffered serial data SD into parallel data DP2 in synchronization with the recovery clock CLK1.

The signal transmitter 10 includes a serializer 11 connected to the internal circuit 51, and a driver 12 connected between the serializer 11 and an output terminal 1. The serializer 11 converts the parallel data DP1 supplied from the internal circuit 51 into the serial data SS in synchronization with the reference clock SP. In the testing process, the serializer 11 converts the parallel data DP1 into the serial data SS in synchronization with the test clock CLK2. The driver 12 buffers the serial data SS supplied from the serializer 11.

The test circuit 20a includes a selector 21 and a clock comparator 23. The selector 21 has an input side connected to a first test terminal 3 and a second test terminal 4, and an output side connected to the serializer 11. The clock comparator 23 has an input side connected to the second test terminal 4 and the clock recovery circuit 42, and an output side connected to a test output terminal 6. The test clock CLK2 transmitted by an external circuit via the second test terminal 4 is, for example, a clock signal having a fixed frequency. Moreover, the test clock CLK2 has a difference phase compared to the reference clock SP. The selector 21 selects one of the reference clock SP and the test clock CLK2, based on a switch signal SC transmitted from an external circuit via the first test terminal 3. The reference clock SP or the test clock CLK2 selected by the selector 21 is supplied to the serializer 11. The clock comparator 23 compares each phase of the recovery clock CLK1 as the converted signal and test clock CLK2, and generates phase error information Sout. For example, the phase error information Sout is transmitted to a logic analyzer (not illustrated) via the test output terminal 6.

Figure 2:
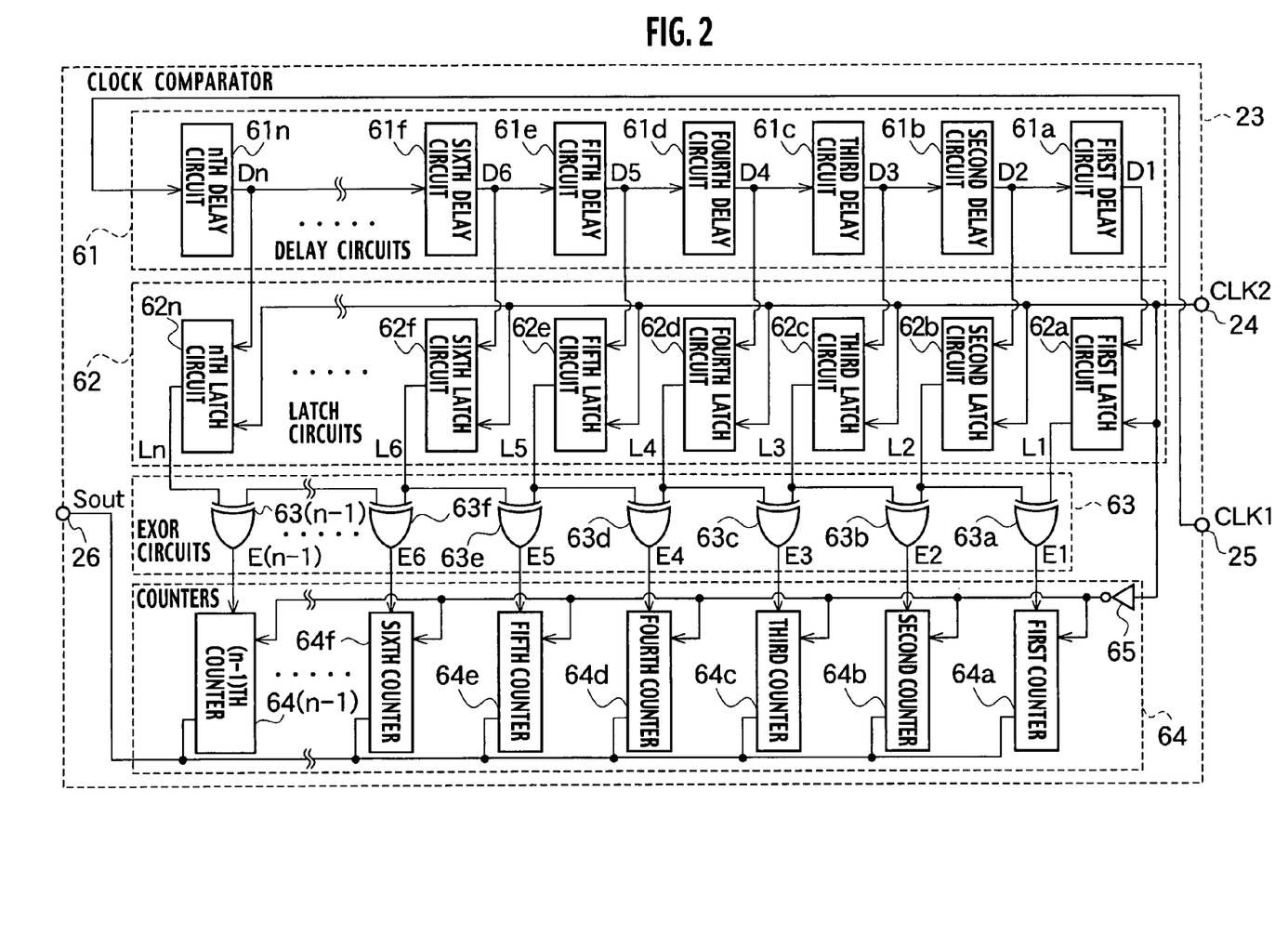
FIG. 2 is a circuit diagram showing a clock comparator according to the embodiment of the present invention.

As shown in FIG. 2, the recovery clock CLK1 is supplied to a comparison clock input terminal 25 of the clock comparator 23. The test clock CLK2 is supplied to a test clock input terminal 24. The clock comparator 23 includes a plurality of delay circuits 61 connected to the comparison clock input terminal 25, a plurality of latch circuits 62 connected to the test clock input terminal 24 and the delay circuits 61, a plurality of exclusive OR (EXOR) circuits 63 connected to the test clock input terminal 24 and latch circuits 62, and a plurality of counters 64 connected between the EXOR circuits 63 and an error information output terminal 26.

The delay circuits 61 include first to n-th delay circuits 61a to 61n (n is integers of 2 or more). The latch circuits 62 include first to n-th latch circuits 62a to 62n. The EXOR circuits 63 include first to (n−1)-th EXOR circuits 63a to 63(n−1). The counters 64 include an inverter 65 and first to (n−1)-th counters 64a to 64(n−1).

The first delay circuit 61a has an input side connected to the second delay circuit 61b, and an output side connected to the first latch circuit 62a. The second delay circuit 61b has an input side connected to the third delay circuit 61c, and an output side connected to second latch circuit 62b. The third delay circuit 61c has an input side connected to the fourth delay circuit 61d, and an output side connected to the third latch circuit 62c. The fourth delay circuit 61d has an input side connected to the fifth delay circuit 61e, and an output side connected to the fourth latch circuit 62d. The fifth delay circuit 61e has an input side connected to sixth delay circuit 61f, and an output side connected to the fifth latch circuit 62e. The sixth delay circuit 61f has an input side connected to the seventh delay circuit (not illustrated), and an output side connected to sixth latch circuit 62f.

The seventh to (n−1)-th delay circuits (not illustrated) are similar to the first to sixth delay circuits 61a to 61f. The n-th delay circuit 61n has an input side connected to the comparison clock input terminal 25, and an output side connected to n-th latch circuit 62n. The n-th delay circuit 61n delays the recovery clock CLK1 for a fixed time, and supplies a n-th delay clock Dn to the (n−1)-th delay circuit. Similarly, first to (n−1)-th delay circuit 61a to 61(n−1) generate first to (n−1)-th delay clock D1 to D(n−1), respectively.

The first latch circuit 62a shown in FIG. 2 has an input side connected to the first delay circuit 61a and the test clock input terminal 24, and an output side connected to the first EXOR circuit 63a. The second latch circuit 62b has an input side connected to the second delay circuits 61b and the test clock input terminal 24, and an output side connected to the first EXOR circuit 63a and the second EXOR circuit 63b. The third latch circuit 62c has an input side connected to the third delay circuit 61c and the test clock input terminal 24, and an output side connected to the second EXOR circuit 63b and the third EXOR circuit 63c. Similarly, the n-th latch circuit 62n has an input side connected to the n-th delay circuit 61n and the test clock input terminal 24, and an output side connected to the (n−1)-th EXOR circuit 63(n−1).

The first latch circuit 62a latches the first delay clock D1 in synchronization with leading edges of the test clock CLK2, and supplies a first latch signal L1 to the first EXOR circuit 63a. The second latch circuit 62b latches the second delay clock D2 in synchronization with leading edges of the test clock CLK2, and supplies a second latch signal L2 to the second EXOR circuit 63b. Similarly, the n-th latch circuit 62n latches the n-th delay clock Dn in synchronization with leading edges of the test clock CLK2, and supplies a n-th latch signal Ln to the (n−1)-th EXOR circuit 63(n−1).

The first EXOR circuit 63a has an input side connected to the first latch circuit 62a and the second latch circuit 62b, and an output side connected to the first counter 64a. The second EXOR circuit 63b has an input side connected to the second latch circuit 62b and the third latch circuit 62c, and an output side connected to the second counter 64b. Similarly, the (n−1)-th EXOR circuit 63(n−1) has an input side connected to n-th latch circuit 62n and the (n−1)-th latch circuit, and an output side connected to the (n−1)-th counter 64(n−1). The first EXOR circuit 63a supplies error detection signal E1 to the first counter 64a when either the first latch signal L1 or second latch signal L2 is a high level signal. The second EXOR circuit 63b supplies error detection signal E2 to the second counter 64b when either the second latch signal L2 or the third latch signal L3 is a high level signal. The third to (n−1)-th EXOR circuits 63c to 63(n−1) are similar to the first and second EXOR circuits 63a and 63b.

The first counter 64a has an input side connected to the first EXOR circuit 63a and the inverter 65, and an output side connected to error signal output terminal 26. The second counter 64b has an input side connected to the second EXOR circuit 63b and the inverter 65, and an output side connected to error signal output terminal 26. Similarly, (n−1)-th counter 64(n−1) has an input side connected to the (n−1)-th EXOR circuit 63(n−1) and the inverter 65, and an output side connected to error signal output terminal 26. The first counter 64a counts a high level signal generated by the first EXOR circuit 63a in synchronization with the test clock CLK2 inverted by the inverter 65. Similarly, the (n−1)-th counter 64(n−1) counts a high level signal generated by the (n−1)-th EXOR circuit 63(n−1) in synchronization with the test clock CLK2 inverted by the inverter 65.

Next, an operation of the I/O circuit 60a according to the embodiment of the present invention will be described by referring to FIGS. 1 to 5C. It is assumed that the number of stages of the delay circuits 61 and the latch circuits 62 shown in FIG. 2 is eight and that there are seven stages of the EXOR circuits 63 and the counters 64.

(A) First, the reference clock generator 30 shown in FIG. 1 generates the reference clock SP which is a polyphase clock, in accordance with the reference signal SRef. As shown in FIGS. 3A to 3D, the reference clock SP is, for example, composed of clock signals having phases different by 90° degree from one another. The selector 21 transmits the reference clock SP to the serializer 11. The serializer 11 converts the parallel data DP1 supplied by the internal circuit 51 into the serial data SS in synchronization with the reference clock SP. The driver 12 buffers the serial data SS supplied by the serializer 11.

(B) The test clock CLK2 is supplied to the selector 21 and the clock comparator 23 via the second test terminal 4 when the test starts. The switch signal SC is supplied to the selector 21 via the first test terminal 3. The selector 21 transmits the test clock CLK2 to the serializer 11 when the switch signal SC is supplied to the selector 21. The serializer 11 converts the parallel data DP1 into the serial data SS in synchronization with the test clock CLK2.

Figure 3A:
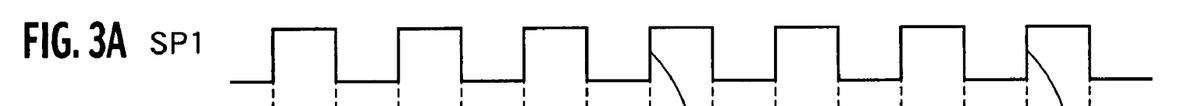
FIGS. 3A to 3F are time charts showing an operation of the semiconductor integrated circuit according to the embodiment of the present invention.
Figure 3B:
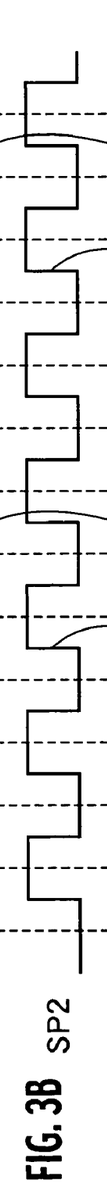
Figure 3C:
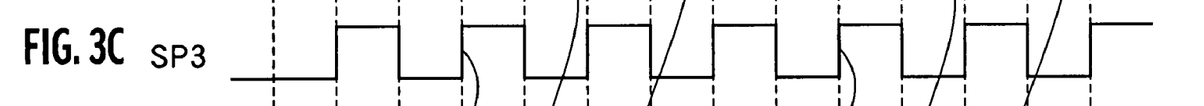
Figure 3D:
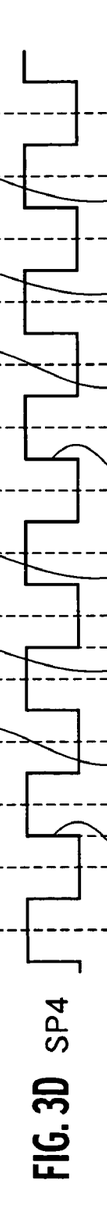
Figure 3E:
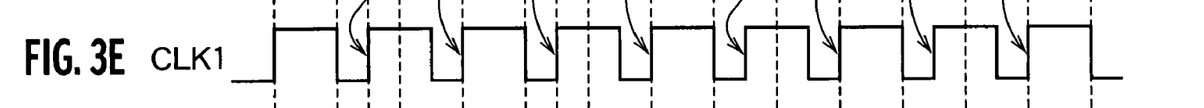
Figure 3F:
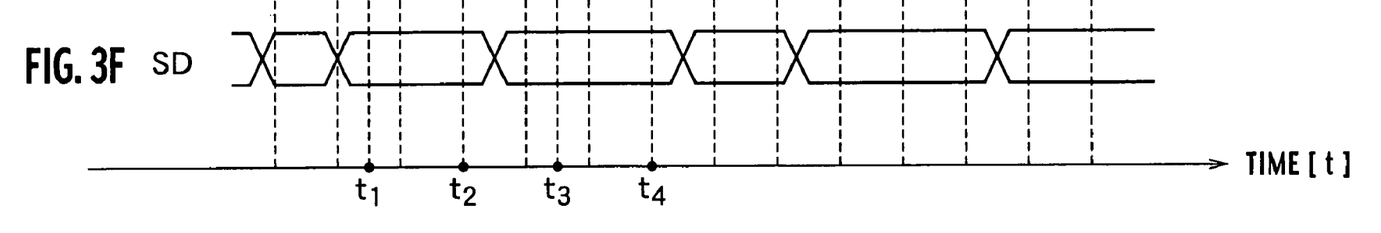

(C) The receiver 41 receives the serial data SS from the driver 12, and buffers the serial data SS. As shown in FIG. 3E, the clock recovery circuit 42 generates the recovery clock CLK1 based on the reference clocks SP1 to SP4 shown in FIGS. 3A to 3D. Here, the clock recovery circuit 42 renders the recovery clock CLK1 to a high level when the buffered serial data SD is at a steady state. As shown in FIG. 3E, the leading edges are generated in the recovery clock CLK1 when the buffered serial data SD shown in FIG. 3F is steady state, i.e., time t1, t2, t3, and t4.

Figure 4A:
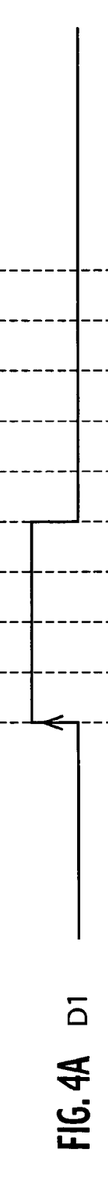
FIGS. 4A to 4I are time charts showing an operation of the clock comparator according to the embodiment of the present invention.
Figure 4B:
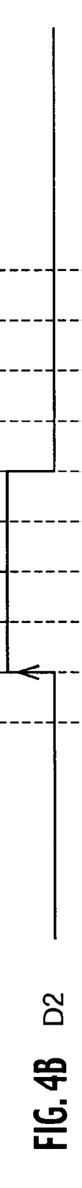
Figure 4C:
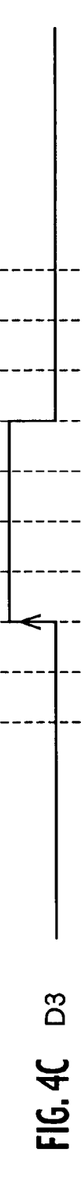
Figure 4D:
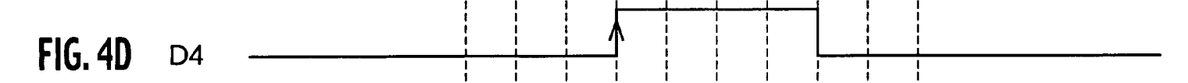
Figure 4E:
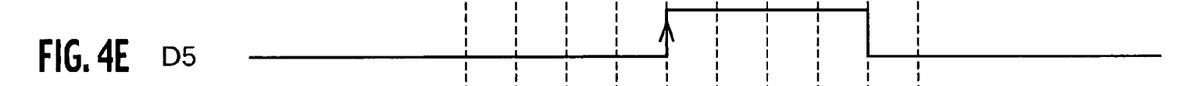
Figure 4F:
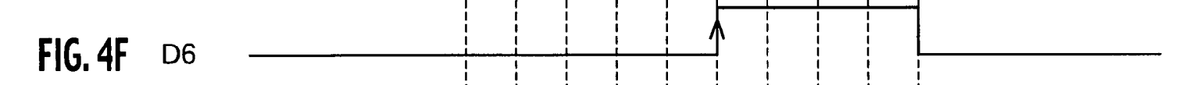
Figure 4G:
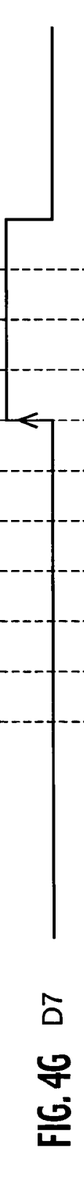
Figure 4H:
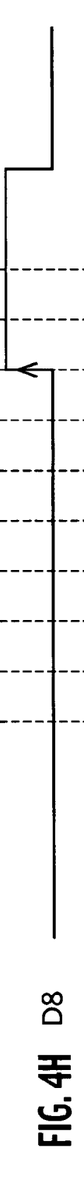

(D) As shown in FIGS. 4A to 4H, the first to eighth delay circuits 61a to 61h shown in FIG. 2 generate first to eighth delay clock D1 to D8, respectively. The eighth delay clock D8 shown in FIG. 4H is set to a high level at the time H. The seventh delay clock D7 shown in FIG. 4G is set to a high level at the time G after a lapse of the time H. Similarly, the first delay clock D1 shown in FIG. 4A is set to a high level at the time A after a lapse of the time B. On the other hand, the test clock CLK2 is set to a high level at the time E as shown in FIG. 4I.

Figure 4I:
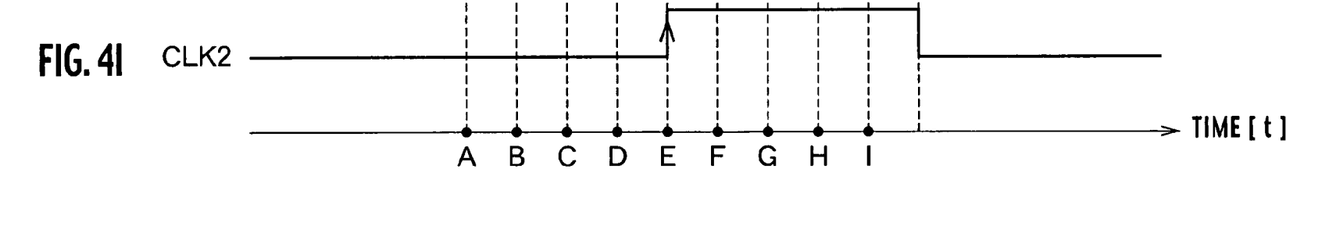

(E) The first to eighth latch circuits 62a to 62h shown in FIG. 2 latch first to eighth delay clocks D1 to D8 shown in FIGS. 4A to 4H in synchronization with leading edges of the test clock CLK2 shown in FIG. 4I, respectively. As a result, first to fifth latch signals L1 to L5 shown in FIG. 2 are set to a high level. The sixth to eighth latch signals L6 to L8 (not illustrated) are set to a low level.

(F) The EXOR circuits 63 shown in FIG. 2 supply the high level signals to the counters 64 at the change point of the first to eighth latch signals L1 to L8. The fifth EXOR circuit 63e shown in FIG. 2 supplies a high level signal to fifth counter 64e. On the other hand, the first to fourth EXOR circuits 63a to 63d, and sixth to eighth EXOR circuits 63f to 63h (not illustrated) generate low level signals.

(G) The fifth counter 64e shown in FIG. 2 counts the high level signal supplied by the fifth EXOR circuits 63e in synchronization with the test clock CLK2. The count values of the counters 64 are transmitted to the test output terminal 6 shown in FIG. 1 via the error information output terminal 26 as the phase error information Sout. With respect to the phase error information Sout shown in FIG. 5A, the extent in the time direction of the distribution data is small. That is, it can be determined that the recovery clock CLK1 is normally generated because each phase of the recovery clock CLK1 and the test clock CLK2 corresponds to each other.

Figure 5A:
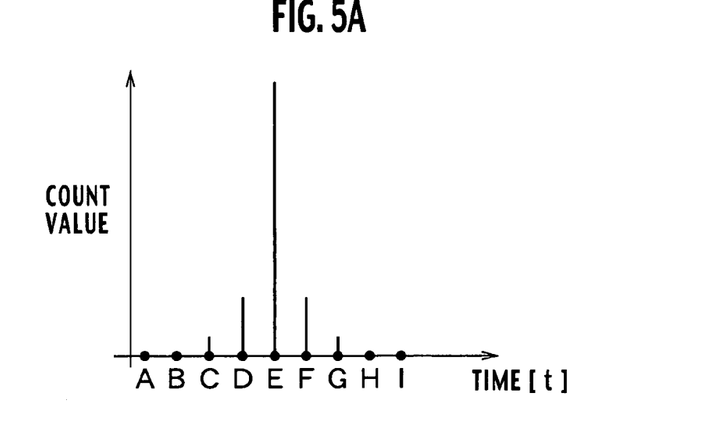
FIGS. 5A to 5C are diagrams showing examples of output signal generated by the clock comparator according to the embodiment of the present invention.
Figure 5B:
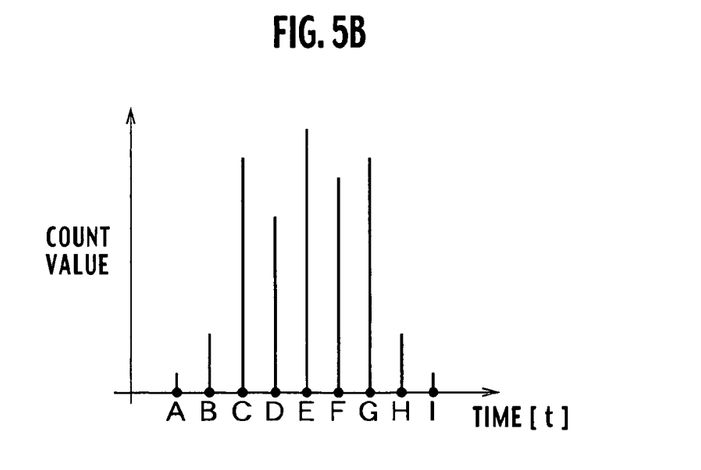

(H) On the other hand, with respect to the phase error information Sout shown in FIG. 5B, the extent in the time direction of the distribution data is large, and there are rapid change points in the count value. In this case, it can be determined that each phase of the recovery clock CLK1 and the test clock CLK2 does not correspond. However, it can be determined that each frequency of the recovery clock CLK1 and the test clock CLK2 is almost equal, and the random noise component is small.

Figure 5C:
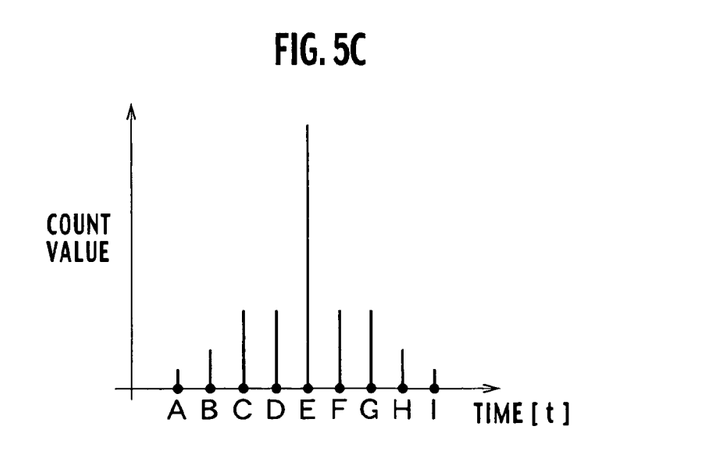

(I) With respect to the phase error information Sout shown in FIG. 5C, the extent in the time direction of the distribution data is large, and there are few rapid change points in the count value. In this case, it can be determined that each phase of the recovery clock CLK1 and the test clock CLK2 does not correspond. In addition, it can be determined that the random noise component is large.

As described above, according to the embodiment of the present invention, it is possible to detect the phase error between each phase of test clock CLK2 and recovery clock CLK1 by the clock comparator 23. Furthermore, it is possible to immediately determine whether clock recovery circuit 42 operates normally on the basis of the phase error information Sout generated by the clock comparator 23. Consequently, it is possible to provide a semiconductor integrated circuit 50a which is capable of executing the self-test in a short time.

FIRST MODIFICATION

Figure 6:
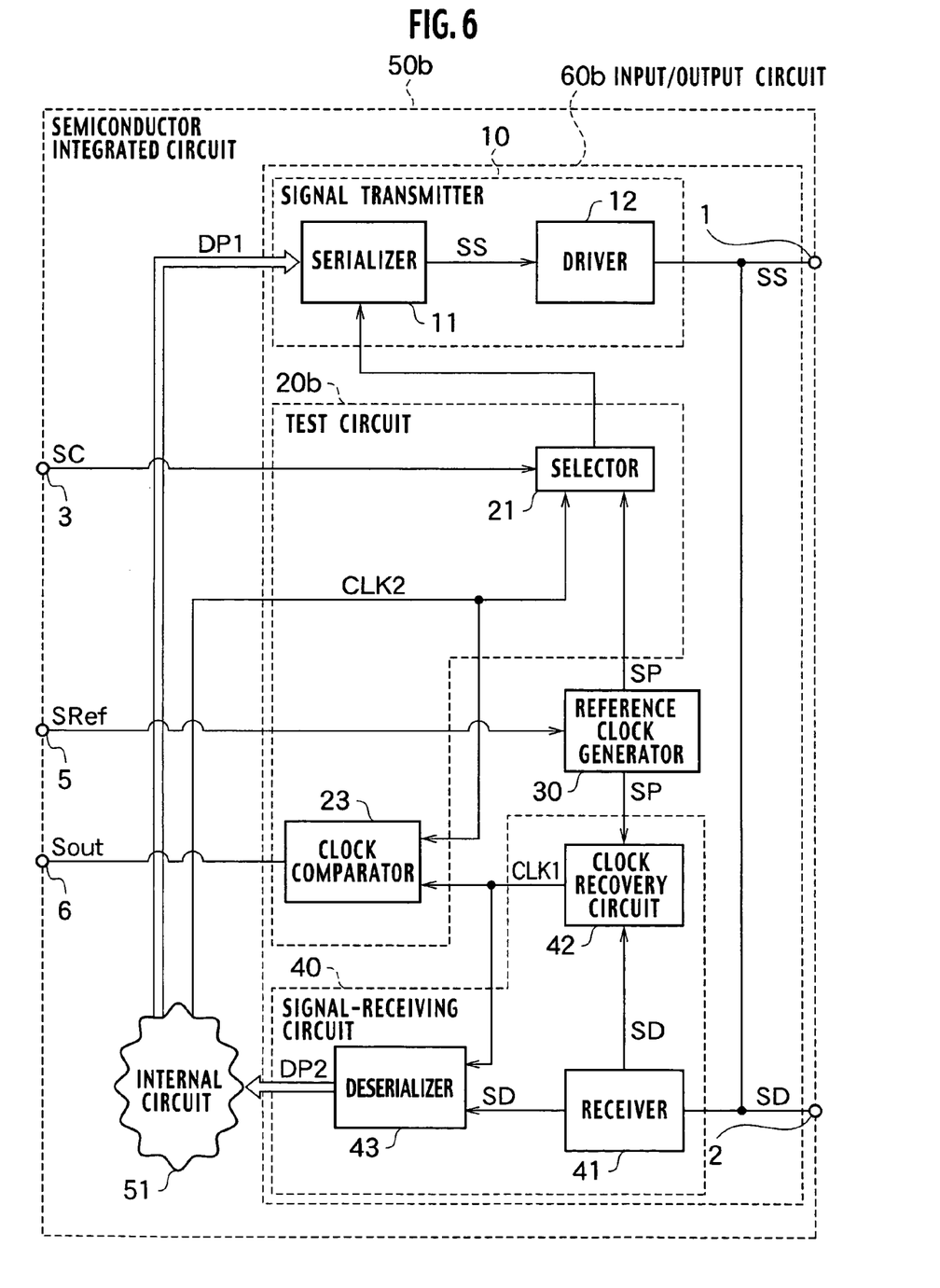
FIG. 6 is a block diagram showing a semiconductor integrated circuit according to a first modification of the embodiment of the present invention.

As a semiconductor integrated circuit 50b according to a first modification of the embodiment of the present invention, as shown in FIG. 6, a clock signal generated by the internal circuit 51 may be used as the test clock. CLK2. That is, any clock signal having a phase different from the reference clock SP can be used as the test clock CLK2. It is assumed that the internal circuit 51 is a digital circuit, and the internal circuit 51 usually includes clock sources such as a phase locked loop (PLL) and a crystal oscillator and the like. According to an I/O circuit 60b shown in FIG. 6, it is possible to remove the second test terminal 4 shown in FIG. 1 since the test clock CLK2 is generated by the internal circuit 51.

SECOND MODIFICATION

Figure 7:
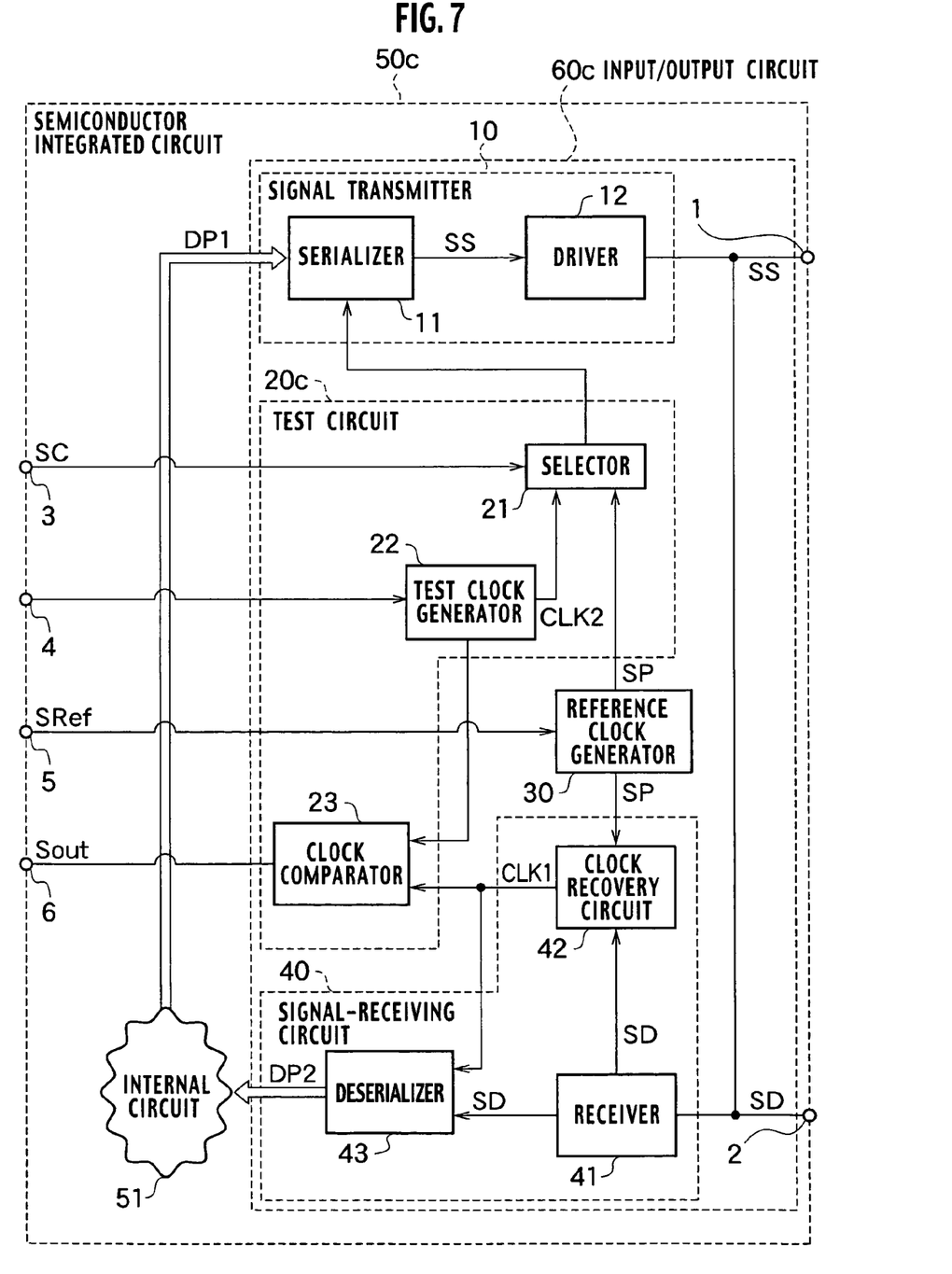
FIG. 7 is a block diagram showing a semiconductor integrated circuit according to a second modification of the embodiment of the present invention.

As a semiconductor integrated circuit 50c according to a second modification of the present invention, as shown in FIG. 7, a test circuit 20c may further includes a test clock generator 22 connected to the second test terminal 4. A voltage-controlled oscillator (VCO) can be used as the test clock generator 22, for example. In this case, a direct current (DC) voltage is supplied to the second test terminal 4. It is possible to control the oscillation frequency of the VCO in proportion to the voltage value of the DC voltage supplied to the second test terminal 4. According to the I/O circuit 60c shown in FIG. 7, it is possible to perform a high-speed test and a low-speed test by the test circuit 20c since the test clock CLK2 is variable.

THIRD MODIFICATION

Figure 8:
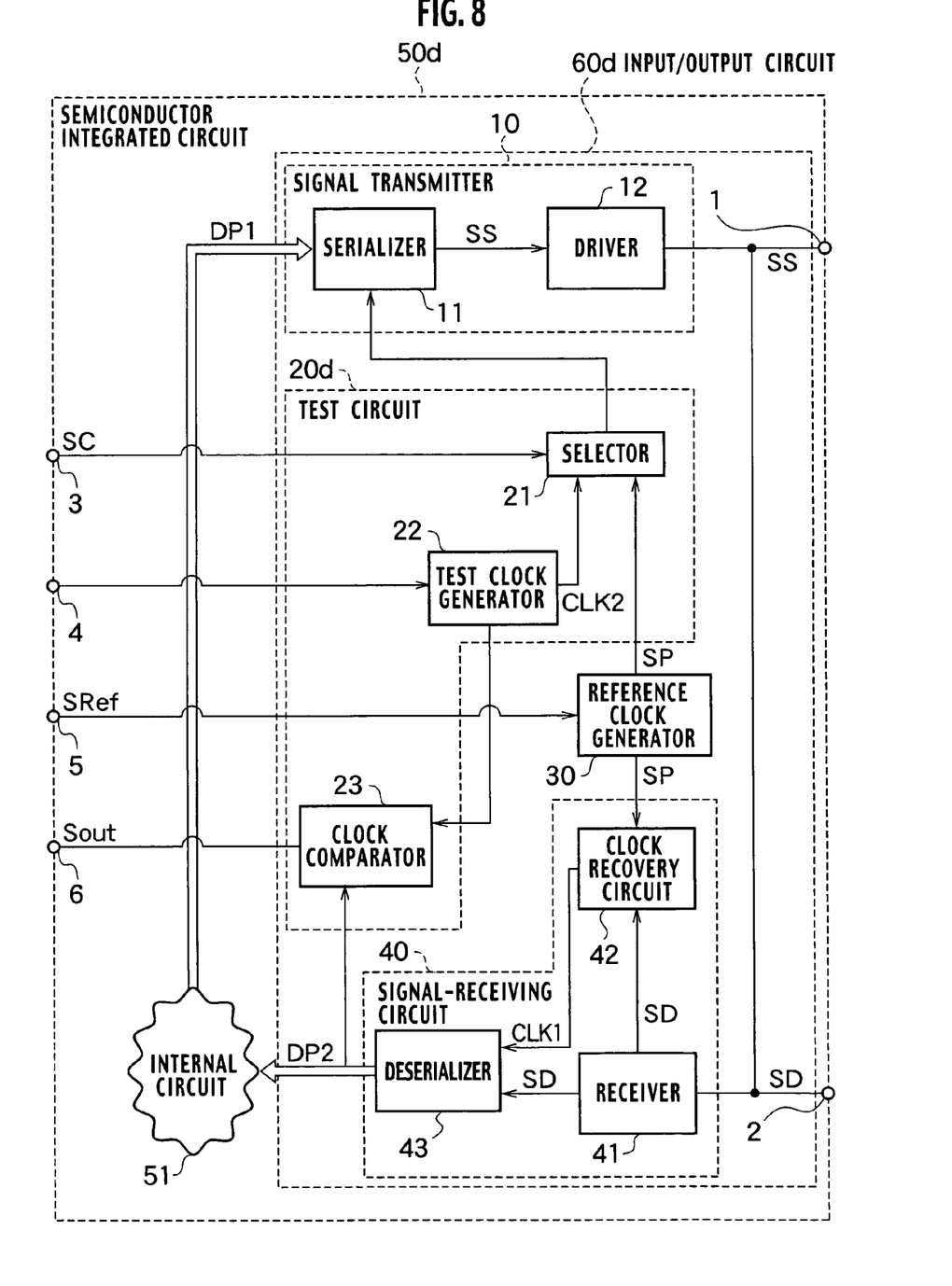
FIG. 8 is a block diagram showing a semiconductor integrated circuit according to a third modification of the embodiment of the present invention.

As a semiconductor integrated circuit 50d according to a third modification of the embodiment of the present invention, as shown in FIG. 8, a clock comparator 23 may compare parallel data DP2 as the converted signal with the test clock CLK2. The clock comparator 23 compares each phase of the parallel data DP2 and the test clock CLK2. That is, the parallel data DP2 is supplied to the comparison clock input terminal 25 shown in FIG. 2. As a result, it is possible for the I/O circuit 60d shown in FIG. 8 to test whether the deserializer 43 operates normally. Additionally, it is possible to perform a high-speed test and a low-speed test by the test circuit 20d since the test clock CLK2 is variable.

OTHER EMBODIMENTS

Various modifications will become possible for those skilled in the art after receiving the teachings of the present disclosure without departing from the scope thereof.

With respect to the aforementioned second modification and third modification, internal circuit 51 may generate the test clock CLK2, in the same way as the first modification. In the second and third modifications, the test clock CLK2 may be supplied from an external circuit via the second test terminal 4, in the same way as the embodiment of the present invention.

In the embodiment of the present invention, description was given of an example in which phase error information Sout is analyzed by use of the logic analyzer. However, it is possible to test a semiconductor integrated circuit automatically by use of a determination device (not illustrated) configured to determine the phase error information Sout. The example has been described, in which the clock comparator 23 transmits the phase error information Sout to the test output terminal 6 as serial data. However, phase error information Sout may be transmitted to the test output terminal 6 as parallel data.

In the embodiment of the present invention, description was given of an example in which the internal circuit 51 transmits the parallel data DP1, and receives the parallel data DP1. However, the internal circuit 51 may transmit and receive serial data. In this case, the driver 12 shown in FIG. 1 transmits the serial data in synchronization with one of the reference clock SP and the test clock CLK2.

Furthermore, in the I/O circuit 60d according to the third modification of the embodiment, the clock comparator 23 may further compare the recovery clock CLK1 with the test clock CLK2. That is, it is possible to perform a high precision test of a semiconductor integrated circuit by preparing a plurality of clock comparators.

What is claimed is:

1. An input/output circuit comprising:
    a reference clock generator configured to generate a reference clock;
    a signal transmitter configured to transmit serial data in synchronization with one of the reference clock and a test clock;
    a signal-receiving circuit connected to the reference clock generator, and configured to receive the serial data transmitted by the signal transmitter, and to generate a converted signal from the serial data in synchronization with the reference clock; and
    a test circuit configured to detect phase error between phase of the converted signal generated by the signal-receiving circuit and phase of the test clock, and to detect noise components included in the converted signal, when the signal transmitter operates in synchronization with the test clock.

2. The input/output circuit of claim 1, wherein the test circuit comprises a test clock generator configured to generate the test clock.

3. The input/output circuit of claim 1, wherein the test circuit comprises a selector configured to supply one of the test clock and the reference clock to the signal transmitter.

4. The input/output circuit of claim 1, wherein the signal-receiving circuit comprises:
    a receiver configured to buffer the serial data; and
    a clock recovery circuit configured to generate a recovery clock as the converted signal, based on the buffered serial data and the reference clock.

5. The input/output circuit of claim 4, wherein the test circuit comprises a clock comparator configured to compare the recovery clock with the test clock.

6. The input/output circuit of claim 1, wherein the signal-receiving circuit comprises:
    a receiver configured to buffer the serial data;
    a clock recovery circuit configured to generate a recovery clock as the converted signal, based on the buffered serial data and the reference clock; and
    a deserializer configured to convert the buffered serial data into parallel data in synchronization with the recovery clock, and to supply the parallel data as the converted signal to the test circuit.

7. The input/output circuit of claim 6, wherein the test circuit comprises a clock comparator configured to compare the parallel data with the test clock.

8. An input/output circuit comprising:
    a reference clock generator configured to generate a reference clock;
    a signal transmitter configured to transmit serial data in synchronization with one of the reference clock and a test clock;
    a signal-receiving circuit configured to receive the serial data, and to generate a converted signal from the serial data; and
    a test circuit configured to detect an error between each phase of the converted signal and the test clock when the signal transmitter operates in synchronization with the test clock,
    wherein the signal-receiving circuit comprises:
        a receiver configured to buffer the serial data; and
        a clock recovery circuit configured to generate a recovery clock as the converted signal, based on the buffered serial data and the reference clock,
    wherein the test circuit comprises a clock comparator configured to compare the recovery clock with the test clock,
    wherein the clock comparator comprises:
        a plurality of delay circuits configured to generate a plurality of delay signals by delaying the recovery clock;
        a plurality of latch circuits configured to generate a plurality of latch signals by latching the delay signals in synchronization with the test clock;

a plurality of EXOR circuits configured to generate a plurality of error detection signals by providing an EXOR operation to the latch signals; and a plurality of counters configured to count the error detection signals in synchronization with the test clock.

9. An input/output circuit comprising:

a reference clock generator configured to generate a reference clock;

a signal transmitter configured to transmit serial data in synchronization with one of the reference clock and a test clock;

a signal-receiving circuit configured to receive the serial data, and to generate a converted signal from the serial data; and a test circuit configured to detect an error between each phase of the converted signal and the test clock when the signal transmitter operates in synchronization with the test clock, wherein the signal-receiving circuit comprises:

a receiver configured to buffer the serial data;

a clock recovery circuit configured to generate a recovery clock as the converted signal, based on the buffered serial data and the reference clock; and a deserializer configured to convert the buffered serial data into parallel data in synchronization with the recovery clock, and to supply the parallel data as the converted signal to the test circuit, wherein the test circuit comprises a clock comparator configured to compare the parallel data with the test clock, wherein the clock comparator comprises:

a plurality of delay circuits configured to generate a plurality of delay signals by delaying the parallel data;

a plurality of latch circuits configured to generate a plurality of latch signals by latching the delay signals in synchronization with the test clock;

a plurality of EXOR circuits configured to generate a plurality of error detection signals by providing an EXOR operation to the latch signals; and a plurality of counters configured to count the error detection signals in synchronization with the test clock.

10. A semiconductor integrated circuit comprising:

an input/output circuit; and an internal circuit configured to perform transmission and reception of signals to external circuits via the input/output circuit, wherein the input/output circuit includes:

a reference clock generator configured to generate a reference clock;

a signal transmitter configured to transmit serial data in synchronization with one of the reference clock and a test clock;

a signal-receiving circuit connected to the reference clock generator, and configured to receive the serial data transmitted by the signal transmitter, and to generate a converted signal from the serial data in synchronization with the reference clock; and a test circuit configured to detect a phase error between phase of the converted signal generated by the signal-receiving circuit and phase of the test clock, and to detect noise components included in the converted signal, when the signal transmitter operates in synchronization with the test clock.

11. The semiconductor integrated circuit of claim 10, wherein the test clock is supplied by the internal circuit.

12. The semiconductor integrated circuit of claim 10, wherein the test circuit comprises a test clock generator configured to generate the test clock.

13. The semiconductor integrated circuit of claim 10, wherein the test circuit comprises a selector configured to supply one of the test clock and the reference clock to the signal transmitter.

14. The semiconductor integrated circuit of claim 10, wherein the signal-receiving circuit comprises:

a receiver configured to buffer the serial data; and a clock recovery circuit configured to generate a recovery clock as the converted signal, based on the buffered serial data and the reference clock.

15. The semiconductor integrated circuit of claim 14, wherein the test circuit comprises a clock comparator configured to compare the recovery clock with the test clock.

16. The semiconductor integrated circuit of claim 10, wherein the signal-receiving circuit comprises:

a receiver configured to buffer the serial data;

a clock recovery circuit configured to generate a recovery clock as the converted signal, based on the buffered serial data and the reference clock; and a deserializer configured to convert the buffered serial data into parallel data in synchronization with the recovery clock, and to supply the parallel data as the converted signal to the test circuit.

17. The semiconductor integrated circuit of claim 16, wherein the test circuit comprises a clock comparator configured to compare the parallel data with the test clock.

18. A semiconductor integrated circuit comprising:

an input/output circuit configured to transmit serial data in synchronization with a test clock, and to generate a converted signal from the serial data, to detect an error between each phase of the converted signal and the test clock; and an internal circuit configured to perform transmission and reception of signals to external circuits via the input/output circuit, wherein the input/output circuit comprises:

a reference clock generator configured to generate a reference clock;

a signal transmitter configured to transmit the serial data in synchronization with one of the reference clock and the test clock;

a signal-receiving circuit configured to receive the serial data, and to generate the converted signal from the serial data in synchronization with the reference clock; and a test circuit configured to detect the error when the signal transmitter operates in synchronization with the test clock, wherein the signal-receiving circuit comprises:

a receiver configured to buffer the serial data; and a clock recovery circuit configured to generate a recovery clock as the converted signal, based on the buffered serial data and the reference clock, wherein the test circuit comprises a clock comparator configured to compare the recovery clock with the test clock, wherein the clock comparator comprises:

a plurality of delay circuits configured to generate a plurality of delay signals by delaying the recovery clock;

a plurality of latch circuits configured to generate a plurality of latch signals by latching the delay signals in synchronization with the test clock;

a plurality of EXOR circuits configured to generate a plurality of error detection signals by providing an EXOR operation to the latch signals; and a plurality of counters configured to count the error detection signals in synchronization with the test clock.

19. A semiconductor integrated circuit comprising:

an input/output circuit configured to transmit serial data in synchronization with a test clock, and to generate a converted signal from the serial data, to detect an error between each phase of the converted signal and the test clock; and an internal circuit configured to perform transmission and reception of signals to external circuits via the input/output circuit, wherein the input/output circuit comprises:
   a reference clock generator configured to generate a reference clock;
   a signal transmitter configured to transmit the serial data in synchronization with one of the reference clock and the test clock;
   a signal-receiving circuit configured to receive the serial data, and to generate the converted signal from the serial data in synchronization with the reference clock; and
   a test circuit configured to detect the error when the signal transmitter operates in synchronization with the test clock, wherein the test circuit comprises a clock comparator configured to compare the parallel data with the test clock, wherein the clock comparator comprises:
   a plurality of delay circuits configured to generate a plurality of delay signals by delaying the parallel data;
   a plurality of latch circuits configured to generate a plurality of latch signals by latching the delay signals in synchronization with the test clock;
   a plurality of EXOR circuits configured to generate a plurality of error detection signals by providing an EXOR operation to the latch signals; and
   a plurality of counters configured to count the error detection signals in synchronization with the test clock.

* * * * *